US007961473B1

(12) United States Patent
Bohannon et al.

(10) Patent No.: US 7,961,473 B1
(45) Date of Patent: Jun. 14, 2011

(54) RETENTION MODULE FOR TOOLLESS HEAT SINK INSTALLATION

(75) Inventors: Mark S. Bohannon, Wake Forest, NC (US); Derek I. Schmidt, Raleigh, NC (US); Pat Gallarelli, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/647,351

(22) Filed: Dec. 24, 2009

(51) Int. Cl.
*H05K 7/20* (2006.01)

(52) U.S. Cl. ........ 361/719; 361/704; 361/709; 257/718; 257/719; 257/727; 165/80.3; 174/16.1; 174/16.3

(58) Field of Classification Search ........................ None
See application file for complete search history.

(56) References Cited

U.S. PATENT DOCUMENTS

| | | | | |
|---|---|---|---|---|
| 6,633,489 | B2 * | 10/2003 | Callahan et al. | 361/771 |
| 6,788,538 | B1 | 9/2004 | Gibbs et al. | |
| 7,009,844 | B2 | 3/2006 | Farrow et al. | |
| 7,050,302 | B2 * | 5/2006 | Llapitan et al. | 361/704 |
| 7,102,889 | B1 * | 9/2006 | Barsun | 361/704 |
| 7,133,285 | B2 * | 11/2006 | Nishimura | 361/715 |
| 7,142,430 | B2 | 11/2006 | Lee et al. | |
| 7,161,805 | B2 * | 1/2007 | Gattuso et al. | 361/704 |
| 7,344,345 | B2 * | 3/2008 | Aukzemas | 411/372 |
| 7,385,823 | B1 | 6/2008 | Desrosiers et al. | |
| 7,480,146 | B2 * | 1/2009 | Coleman et al. | 361/719 |
| 7,518,875 | B2 | 4/2009 | Desrosiers et al. | |
| 7,520,313 | B2 | 4/2009 | Lai et al. | |
| 7,539,018 | B2 | 5/2009 | Murr et al. | |
| 7,852,633 | B2 * | 12/2010 | Ito | 361/715 |
| 2002/0060064 | A1 | 5/2002 | Yu | |

FOREIGN PATENT DOCUMENTS

JP 2004-071839 8/2002

* cited by examiner

*Primary Examiner* — Boris L Chervinsky
(74) *Attorney, Agent, or Firm* — Thomas E. Tyson

(57) ABSTRACT

An integrated circuit is disposed on a circuit board. A heat sink retention module includes a bracket, members, and coil springs. The members extend through the coil springs and corresponding holes within the bracket to attach to the board. A heat sink is removably installed within the bracket in a toolless manner, such that the heat sink comes into contact with the integrated circuit. The heat sink and the bracket join together to become a single entity that is permitted to float along an axis perpendicular to a surface of the circuit board. The coil springs are tuned to define a predetermined force at which the heat sink is pushed against the integrated circuit. The module can include a latch having tabs bent at different angles relative to one another to balance forces applied by the tabs against the heat sink while the latter is being installed within the bracket.

19 Claims, 5 Drawing Sheets

RETENTION MODULE FOR TOOLLESS HEAT SINK INSTALLATION

FIELD OF THE INVENTION

The present invention relates generally to the installation of a heat sink over an integrated circuit of a circuit board so that the heat sink comes into contact with the integrated circuit. More particularly, the present invention relates to a retention module that is mounted to the circuit board to permit the heat sink to be installed over the integrated circuit in a toolless manner and that provides for certain advantages.

BACKGROUND OF THE INVENTION

In most types of electronic devices, there are one or more circuit boards that have integrated circuits mounted on them. Examples of integrated circuits include processors, such as central-processing units (CPUs), as well as other types of integrated circuits. Integrated circuits can emit an extraordinary amount of heat during their operation. If this heat is not moved away and expelled from the integrated circuits, the integrated circuits can fail.

Therefore, for integrated circuits that generate sufficient heat, components known as heat sinks are attached to the circuit board so that they come into contact with the integrated circuits. Heat from an integrated circuit is transferred to a heat sink, which dissipates the heat away from the integrated circuit. Heat sinks may be passive or active. Passive heat sinks typically include a number of highly heat conductive fins, whereas active heat sinks typically include fans.

SUMMARY OF THE INVENTION

A system of an embodiment of the invention includes a circuit board on which an integrated circuit is disposed, a heat sink retention module, and a heat sink. The heat sink retention module includes a bracket, a number of members, and a number of coil springs. The members extending through the coil springs and corresponding holes within the bracket to attach to the circuit board. The heat sink is removably installed within the bracket of the heat sink retention module in a toolless manner, such that the heat sink comes into contact with the integrated circuit.

A heat sink retention module of an embodiment of the invention is for installing a heat sink over an integrated circuit on a circuit board in a toolless manner. The heat sink retention module includes a bracket, a number of coil springs, and a number of members. The bracket has a number of holes. The coil springs are inserted within the holes of the bracket. The members are inserted through the coil springs and attachable to the circuit board. The heat sink is removably installable within the bracket in the toolless manner, such that the heat sink comes into contact with the integrated circuit.

A method of an embodiment of the invention includes a user inserting a tab of a heat sink into a corresponding slot of a bracket of a heat sink retention module in a toolless manner. The heat sink retention module including a bracket, a number of members, and a number of coil springs. The members extend through the coil springs and corresponding holes within the bracket to attach to a circuit board. The user, also in the toolless manner, moves a latch rotatably attached to the bracket, from an open position to a closed position, to secure the heat sink to the bracket such that the heat sink comes into contact with an integrated circuit on the circuit board.

DETAILED DESCRIPTION OF THE DRAWINGS

Figure 1:
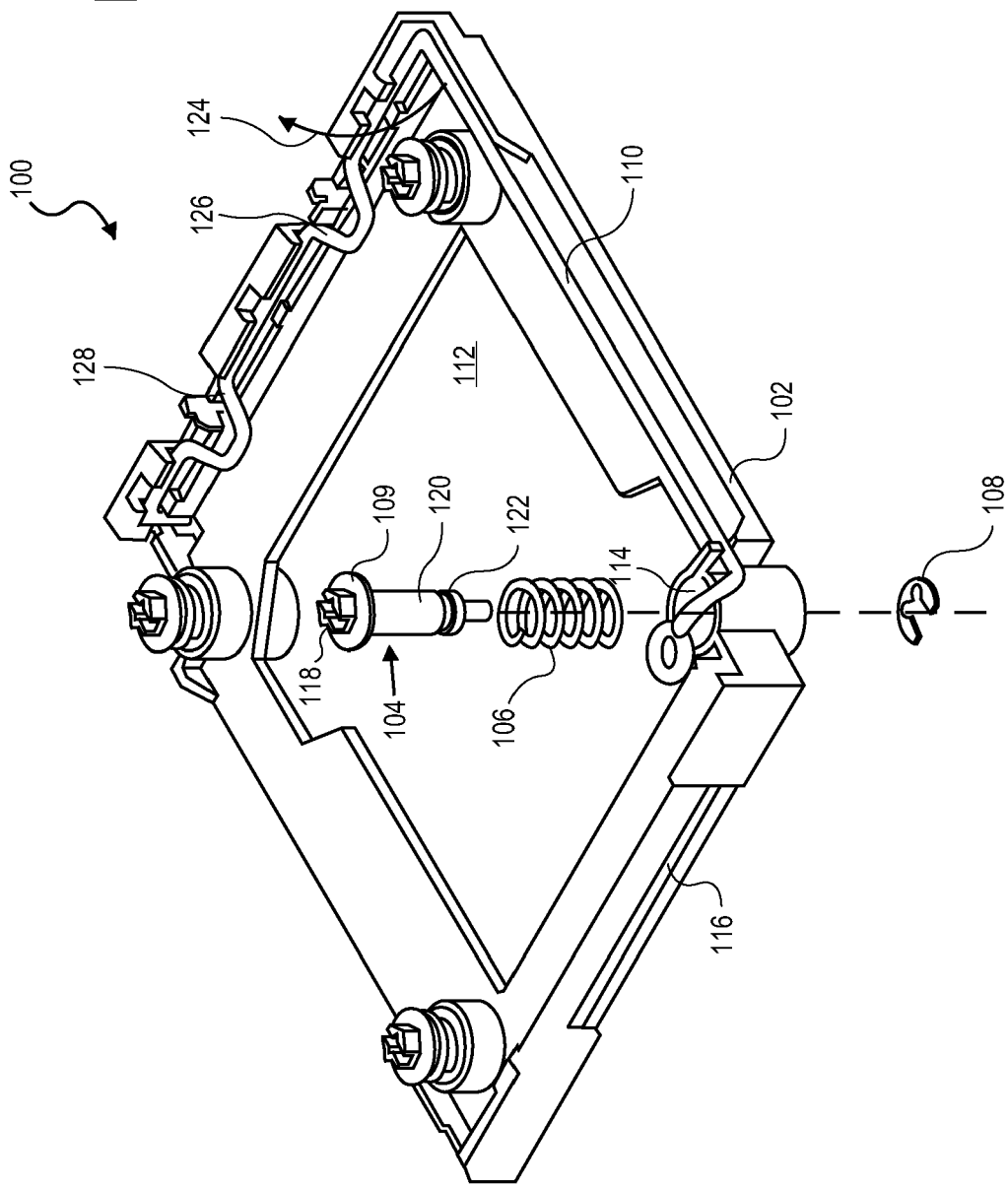
FIG. 1 is a diagram of a heat sink retention module, according to an embodiment of the present invention.

As noted in the background section, heat sinks are commonly attached to circuit boards so that they come into contact with integrated circuits to dissipate heat generated by the integrated circuits. There are two manners by which heat sinks can be attached to circuit boards. In the first approach, a physical tool such as a screw driver is used to secure a heat sink to a circuit board over an integrated circuit. In the second approach, no tools are used to secure a heat sink to a circuit board over an integrated circuit. This latter approach is referred to as a toolless approach or manner.

In accordance with the first approach in which a physical tool like a screw driver is used, a heat sink typically includes a number of screws that attach the heat sink directly to the circuit board. The screws may have coil springs around them so that the heat sink pushes against an integrated circuit with a desired force. This is advantageous, because if the heat sink does not push against the integrated circuit with enough force, heat transfer between the integrated circuit and the heat sink may not be optimal. If the heat sink pushes against the integrated circuit with too much force, a thermal compound that typically is applied onto the integrated circuit to aid in heat transfer between the integrated circuit and the heat sink may be expelled from between the integrated circuit and the heat sink. As such, heat transfer may again not be optimal. Furthermore, if the heat sink pushes against the integrated circuit with too much force, solder joints that attach the integrated circuit to the circuit board can become damaged.

The disadvantage to a tooled manner to attach a heat sink is that removal and attachment of the heat sink to and from a circuit board over an integrated circuit takes a relatively long time as compared to when no tools are used. For example, a user may have to maintain a large number of computing devices. If the processors of all the computing devices are to be upgraded, the user first has to unscrew the heat sink located over each processor before the user can switch out the processor for a new one. The user then has to screw the heat sink back on, over the new processor that has been installed. The time it takes to perform this process for a large number of computing devices can result in the upgrade process taking a prohibitively long time for one person.

Therefore, in accordance with the second, toolless approach in which no physical tools like screw drivers are used, a heat sink is typically inserted into some type of heat sink retention module that has been pre-attached to the circuit board, and a latch actuated to secure the heat sink within the module. In this respect, removal and attachment of the heat sink is achieved much more quickly than when tools are employed, which is advantageous. However, existing toolless approaches suffer from a notable disadvantage, which is that it is difficult to change the force at which the heat sink pushes against an integrated circuit for optimal heat transfer.

For example, a latch like a bail latch may be used to secure the heat sink to a retention module so that the heat sink pushes against the integrated circuit at a desired force. In this situation, the bail latch is particularly modeled so that heat sink pushes against the integrated circuit at the desired force when the latch secures the heat sink. However, if a different type of integrated circuit and/or a different type of heat sink requires a different force at which the heat sink pushes against the integrated circuit, a new bail latch has to be designed to apply this different force. The old bail latch has to be removed—which is difficult to accomplish, since the latch is typically permanently attached to the retention module—and replaced with the new latch.

Furthermore, modeling bail latches so that heat sinks push against integrated circuits at a desired force is not a trivial task. Because of the nature by which such a bail latch typically works—where the latch is permanently and rotatably attached to one corner of a retention module and rotated to be secured at another corner of the module—there are many forces that have to be taken into consideration so that a heat sink ultimately pushes against an integrated circuit at a desired force. Such forces include a force to provide an optimal thermal interface between the integrated circuit and the heat sink, where a thermal material such as thermal compound is disposed between the circuit and the heat sink. Another such force includes a force to adequately retain the sink against the integrated circuit during occurrences of mechanical shock and/or vibration. A third such force is a force to ensure that optimal pressure is applied to the solder joints bonding the integrated circuit to the circuit board, or to the socket connector that attaches the integrated circuit to the circuit board.

Embodiments of the present invention overcome the disadvantages of both the toolless and tooled manners by which heat sinks can be secured to circuit boards, and provide the advantages of both these approaches as well. Embodiments of the invention provide for a toolless approach by which a heat sink is secured over an integrated circuit mounted on a circuit board, and in this respect, share the advantages of conventional toolless approaches noted above. However, unlike conventional toolless approaches, embodiments of the invention permit the force at which a heat sink pushes against the integrated circuit to be changed quickly and easily, without extensive modeling.

In particular, embodiments of the invention employ members like screws that are surrounded by coil springs to attach a bracket of a heat sink retention module to a circuit board such that the bracket is permitted to float along an axis perpendicular to the surface of the circuit board. The bracket, in other words, is not rigidly attached to the circuit board, but rather can move up and down in relation to the circuit board. The coil springs are selected so that they have a spring force that ensures the heat sink is pushed against the integrated circuit with a desired force.

To change the force at which the heat sink is pushed against the integrated circuit when the heat sink is installed within the bracket, the coil springs can be easily removed and replaced with coil springs that define and provide a different force at which the heat sink is pushed against the integrated circuit. Coil springs do not have to be modeled as extensively as bail latches do, and indeed are commercially available at different spring forces, so that the force at which the heat sink pushes against the integrated circuit can be changed without involved and complicated modeling as with bail latches. A bail latch is used in embodiments of the invention just to secure the heat sink to the bracket, and not to push the heat sink against the integrated circuit at the desired force, as in the prior art.

FIG. 1 shows a heat sink retention module 100, according to an embodiment of the invention. The retention module 100 includes a bracket 102. The retention module 100 also includes a number of screws with corresponding coil springs, clips, and washers. One particular screw 104, having a corresponding coil spring 106, a corresponding clip 108, and a corresponding washer 109 is explicitly called out in FIG. 1 as representative of all the screws, coil springs, clips and washers. The retention module 100 further includes a latch 110.

The bracket 102 includes an opening 112. The opening 112 exposes an integrated circuit on a circuit board when the bracket 102 is mounted to the circuit board. As such, a heat sink that is attached to the heat sink retention module 100 comes into contact with and pushes against the integrated circuit. The bracket 102 further includes holes corresponding to the screws, of which hole 114 is explicitly called out in FIG. 1 as representative of all the holes. The bracket 102 also includes a slot 116 that is receptive to a corresponding tab of a heat sink.

The screw 104 is more generally referred to as a member. The washer 109 is situated around the screw 104, and presses against a head 118 of the screw 104. The coil spring 106 is then positioned around a body 120 of the screw 104. The coil spring 106 presses against the washer 109. The resulting assembly of the screw 104, the washer 109, and the coil spring 106 is then inserted into the hole 114. Thereafter, the clip 108 is attached to a groove 122 within the screw 104 to secure the coil spring 106 around the body 120 of the screw 104 between the clip 108 and the washer 109. The coil spring 106 can be relatively tall, have a low spring rate, and be pre-compressed against the bracket 102 to achieve relatively low spring force variation over a relatively large height range of the integrated circuit with which the heat sink is to make contact.

The latch 110 is specifically a bail latch. In FIG. 1, the latch 110 is depicted in a closed position, in which the latch 110 is locked into place on the bracket 102. The latch 110 is rotatably attached to the bracket 102, and can be rotated to an open position as indicated by the arrow 124. The latch 110 can thus be rotated downwards from the open position to the closed position, and can be rotated upwards from the closed position to the open position. In the open position of the latch 110, a heat sink can be inserted into and removed from the bracket 102, whereas in the closed position of the latch 110, the heat sink is rigidly secured to the bracket 102 via the latch 110. In the closed position of the latch 110, the force at which the heat sink is secured to the bracket 102 is greater than the spring forces of the coil springs, such as the coil spring 106.

The latch 110 includes two tabs 126 and 128. The tabs 126 and 128 secure an end of a heat sink to the bracket 102 when the latch 110 is in the closed position. By comparison, the other end of the heat sink is secured to the bracket 102 via a corresponding tab being inserted into the slot 116 of the bracket 102, as has been described. The tabs 126 and 128 are positioned along the latch 110 at different angles relative to one another, as is described in more detail later in the detailed description.

Figure 2:
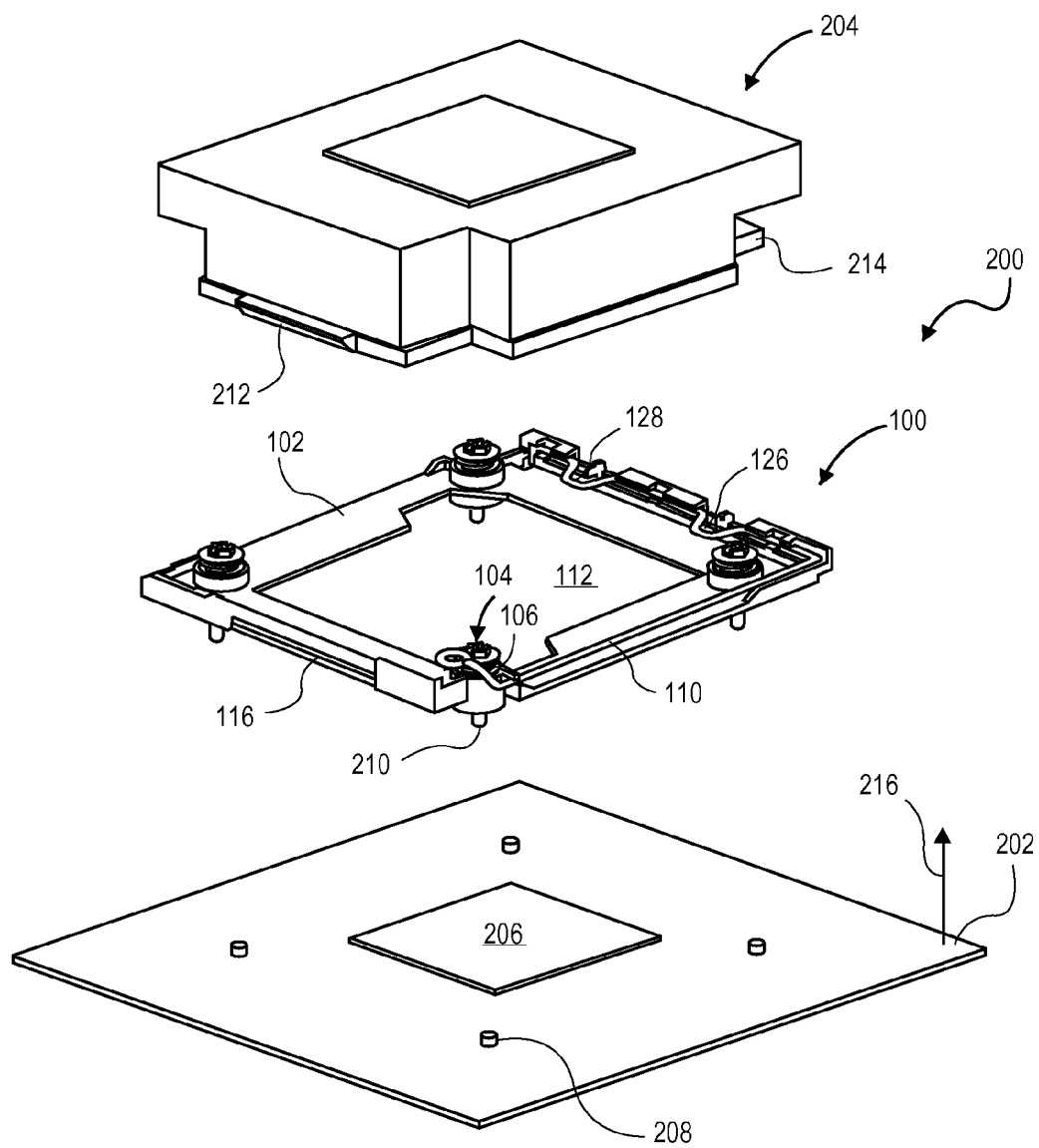
FIG. 2 is a diagram in exploded form of a system including the heat sink retention module of FIG. 1, a heat sink, and a circuit board having an integrated circuit, according to an embodiment of the present invention.

FIG. 2 shows a system 200, according to an embodiment of the invention. The system 200 is depicted in FIG. 2 in exploded form as including the heat sink retention module 100, a circuit board 202, and a heat sink 204. An integrated circuit 206, such as a processor, is disposed on the circuit board 202. The heat sink 204 as depicted in FIG. 2 is a passive heat sink, but alternatively the heat sink 204 may be an active heat sink, or another type of heat sink.

The heat sink retention module 100 is attached to the circuit board 202 via ends of the screws, such as the end 210 of the screw 104 as explicitly called out in FIG. 2, being attached to the circuit board 202. As specifically depicted in FIG. 2, the circuit board 202 includes a number of standoffs, such as the standoff 208 as explicitly called out in FIG. 2. The end 210 of the screw 104 is inserted into and secured to (i.e., screwed into) the standoff 208. More generally, it is said that the screw 104 securely mates with the standoff 208.

In this respect, just the screw 104 of the retention module 100 is rigidly attached to the circuit board 202. The bracket 102 of the retention module 100, by comparison, is not rigidly attached to the circuit board. Rather, after the screw 104 has been screwed into the standoff 208 of the circuit board 202, the bracket 102 is permitted to float along an axis 216 perpendicular to the surface of the circuit board 202, between the clip 108 and the washer 109, which are not explicitly called out in FIG. 2. This floating motion is governed by the coil springs, such as the coil spring 106.

The heat sink 204 includes a tab 212 and an end 214. In the closed position of the latch 110, the heat sink 204 is rigidly attached to the bracket 102. Specifically, the tab 212 is inserted into the slot 116 of the bracket 102, and tabs 126 and 128 of the latch 110 secure the end 214 of the heat sink 204 against the bracket 102. Rigid attachment of the heat sink 204 to the bracket 102 results in the heat sink being positioned over the integrated circuit 206 and coming into contact with the integrated circuit 206 through the opening 112 within the bracket 102.

Rigid attachment of the heat sink 204 to the bracket 102 also results in the heat sink 204 and the bracket 102 being joined together to become or form a single entity. This single entity is permitted to float along the axis 216 that is perpendicular to the surface of the circuit board 202, as governed by the coil springs like the coil spring 106. That is, the heat sink 204 is not rigidly attached to the circuit board 202. Rather, as noted above, the only components within the system 200 that are rigidly attached to the circuit board 202 are the screws, such as the screw 104, via the standoffs, such as the standoff 208.

The coil springs each have a predefined spring force, such that together the coil springs are tuned to provide and define a predetermined force at which the heat sink 204 is pushed against the integrated circuit 206. The latch 110 just rigidly attaches the heat sink 204 to the bracket 102, and does not push the heat sink 204 against the integrated circuit 206. Rather, the coil springs like the coil spring 104 push the heat sink 204 against the integrated circuit 206. Therefore, the coil springs, and not the latch 110, control the force at which the heat sink 204 is pushed against the integrated circuit 206.

A person with sufficient strength to overcome this force could grasp the heat sink 204 and still pull the heat sink 204 (and the bracket 102 to which the heat sink 204 is securely attached) upwards along the axis 216. However, when the person lets go, the coil spring 106 will again cause the heat sink 204 to push against the integrated circuit 206 with the predetermined force. Likewise, a person could push against the heat sink 204 (and/or the bracket 102 to which the heat sink 204 is securely attached) downwards along the axis 216, so that the heat sink 204 pushes against the integrated circuit 206 with additional force. However, when the person lets go, the coil spring 106 will again cause the heat sink 204 to push against the heat sink 204 with the desired predetermined force. In this way, then, the heat sink and the bracket 102 are permitted to float, instead of being rigidly fixed to the circuit board 202.

Figure 3:
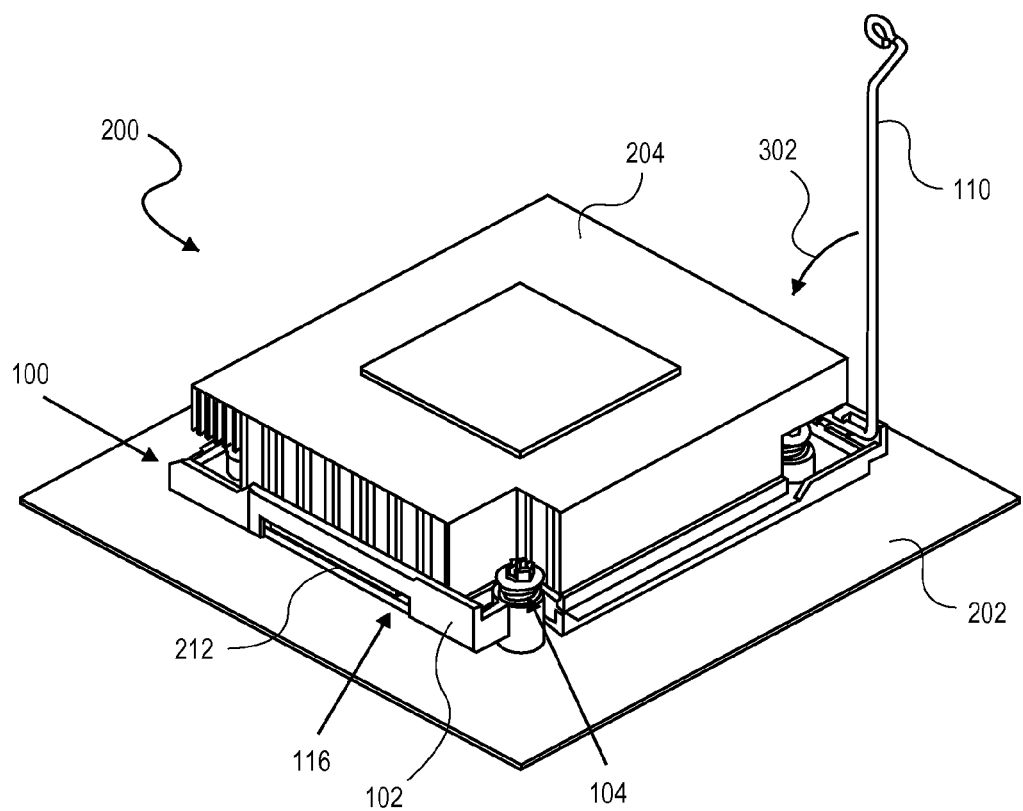
FIG. 3 is a diagram of the system of FIG. 2 in non-exploded form, according to an embodiment of the present invention.

FIG. 3 shows the system 200 in non-exploded form, according to an embodiment of the invention. The heat sink retention module 100 has been attached to the circuit board 202. The latch 110 is in the open position in FIG. 3, and the heat sink 204 has been inserted into the bracket 102. Specifically, the tab 212 has been inserted into the slot 116 of the bracket 102. When the latch 110 is rotated to the closed position, as indicated by the arrow 302, the tabs 126 and 128 of the latch 110 secure the end 214 of the heat sink 204 to the bracket 102, where the tabs 126 and 128 and the end 214 cannot be seen in FIG. 3.

As has been described, then, the heat sink 204 is removably installable within the bracket 102 of the heat sink retention module 100 in a toolless manner. No tools are required to install the heat sink 204 into or remove the heat sink 204 from the bracket 102. To install the heat sink 204 into the bracket 102, the latch 110 is moved to the open position without tools, the heat sink 204 is placed into the bracket 102 such that the tab 212 is inserted into the slot 116 of the bracket 102, and the latch 110 is moved to the closed position, again without tools. To remove the heat sink 204 from the bracket 102, the latch 110 is moved to the open position with tools, and the heat sink 204 removed from the bracket 102.

Figure 4:
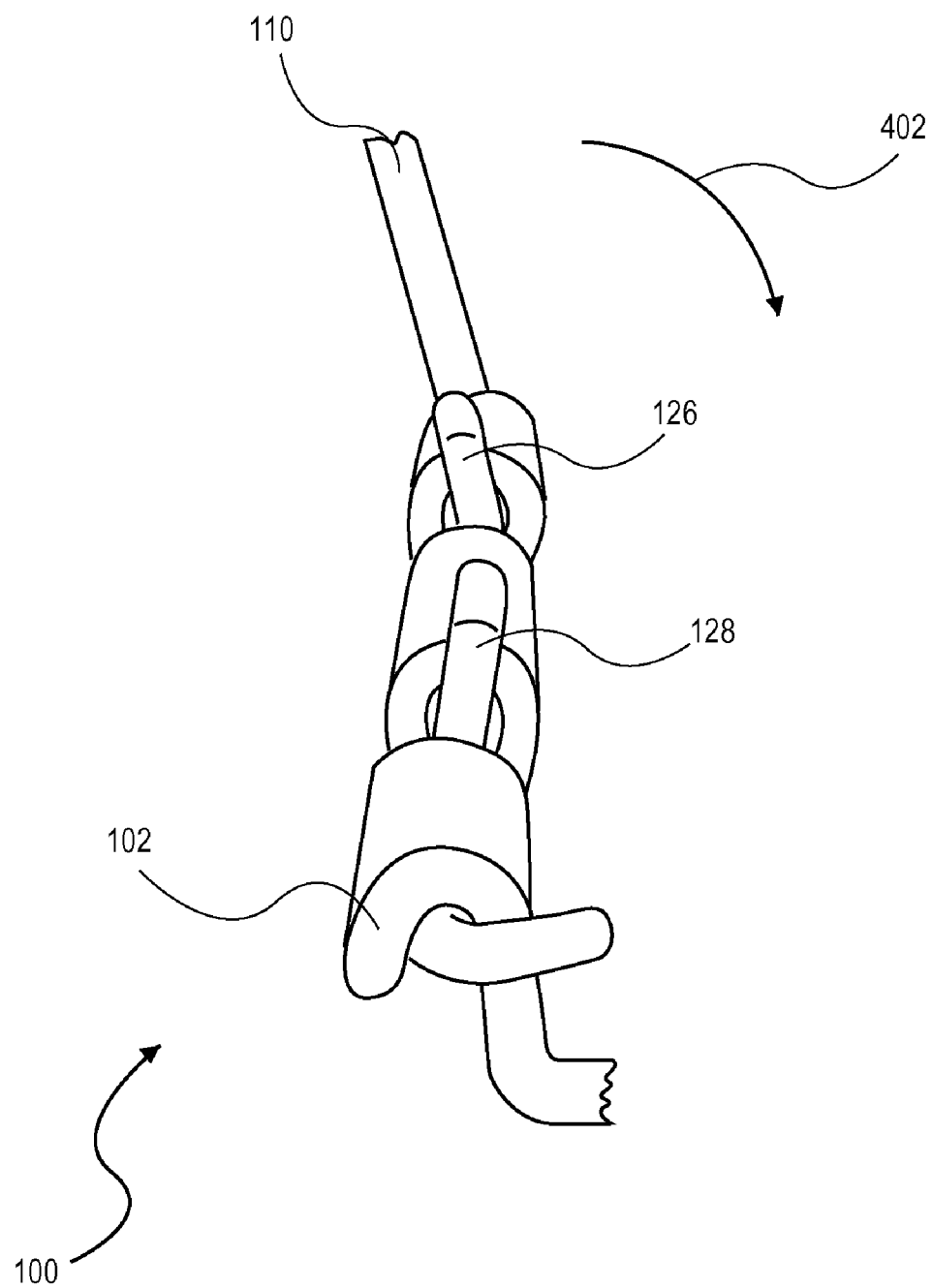
FIG. 4 is a diagram of a portion of the heat sink retention module of FIG. 1 in which tabs of a latch of the retention module are depicted in detail, according to an embodiment of the present invention.

FIG. 4 shows a portion of the heat sink retention module 100 in which the tabs 126 and 128 of the latch 110 are depicted in detail in relation to a portion of the bracket 102, according to an embodiment of the invention. The view of FIG. 4 is opposite to that of FIG. 1. In FIG. 1, in which the latch 110 is in the closed position, the latch 110 is rotated clockwise to move the latch 110 to the open position, as indicated by the arrow 124, and then is rotated counter-clockwise to move the latch 110 back to the closed position. In FIG. 4, in which the latch 110 is in the open position, the latch 110 is rotated to clockwise to move the latch 110 to the closed position, as indicated by the arrow 402, and then is rotated counter-clockwise to move the latch 110 back to the open position.

FIG. 4 is presented to show that the tabs 126 and 128 are positioned along the latch 110 at different angles relative to one another. That is, the tabs 126 and 128 are bent at slightly different angles. As such, when the latch 110 is moved from the open position to the closed potion as indicated by the arrow 402, the tab 128 makes contact with the heat sink 204 (not depicted in FIG. 4) before the tab 126 does. This permits the forces applied by the tabs 126 and 128 against the heat sink 204 to be balanced while the heat sink is being installed within the bracket 102 (that is, while the latch 110 is being moved from the open position to the closed position).

For instance, if the tabs 126 and 128 were instead positioned along the latch at the same angle, then the tabs 126 and 128 would make contact with the heat sink 204 at the same time while the latch was being moved from the open position to the closed position. However, the arm of the latch 110 that is rotated by the user is closer to the tab 126 than it is to the tab 128. As such, the force applied by the tab 126 would be larger than the force applied by the tab 128, which can result in the heat sink 204 pushing against the integrated circuit 206 with non-uniform force. By bending the tab 128 slightly inwards as compared to the tab 126, as in FIG. 4, the tab 128 contacts the heat sink 204 before the tab 126 does, which results in the forces applied by the tabs 126 and 128 being at least substantially equal to one another, resulting in the heat sink 204 pushing against the integrated circuit 206 with at least substantially uniform force.

Figure 5:
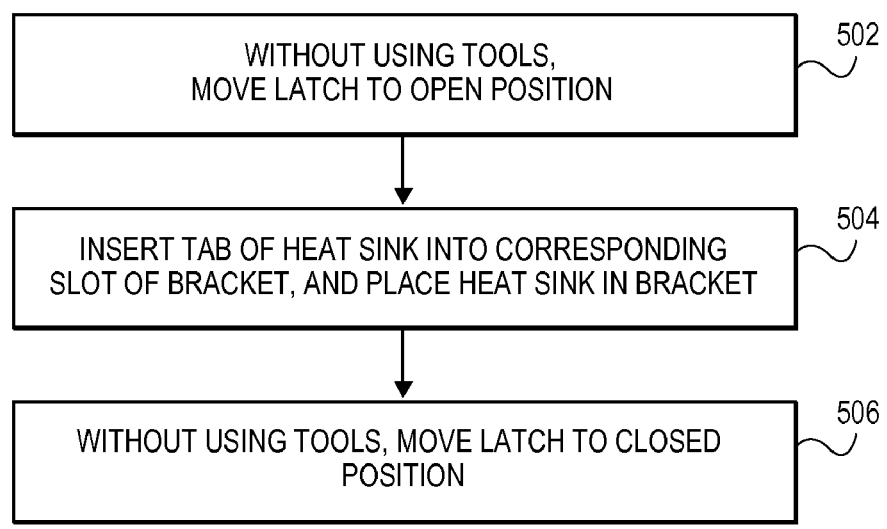
FIG. 5 is a flowchart of a method of use, according to an embodiment of the present invention.
Figure 5:
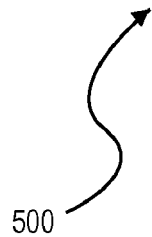

In conclusion, FIG. 5 shows a method 500 for using the heat sink retention module 100 within the system 200, according to an embodiment of the invention. A user unlocks the latch 110 of the heat sink retention module 100 from the bracket 102 of the retention module 100 and moves the latch 110 the open position (502). It is noted that unlocking the latch 110 from the bracket 102 of the retention module 100 and moving the latch 110 to the open position is performed in part 502 without using tools, and thus is performed in a toolless manner.

The user then inserts the tab 212 of the heat sink 204 into the slot 116 of the bracket 102, and places the heat sink 204 so that the heat sink 204 rests in the bracket 102 (504). Part 504 is again performed without using tools, and thus is performed in a toolless manner. Finally, the user moves the latch 110 to the closed position and locks the latch on the bracket 102 (506). As with parts 502 and 504, part 506 is performed without using tools, and thus is performed in a toolless manner. In one embodiment, prior to the user moving the latch 110, the user may have to push downwards on the top of the heat sink 204 towards the end 214, and not release this force until the tabs 126 and 128 have engaged the end 214 of the heat sink 204.

As has been described, moving the latch 110 from the open position to the closed position secures the heat sink 204 to the bracket 102, such that the heat sink 204 comes into contact with the integrated circuit 206 on the circuit board 202. The heat sink 204 is rigidly secured to and becomes a single movable entity with the bracket 102. This entity is permitted to float along the axis 216 perpendicular to the surface of the circuit board 202, as a result of the screws like the screw 104 extending through corresponding holes like the hole 114 within the bracket 102 to attach to the circuit board 202.

Securing the heat sink 204 to the bracket 102 also results in the heat sink 204 being pushed against the integrated circuit 206 at a predetermined force defined and provided by the coil springs, such as the coil spring 106. As the user moves the latch 110 from the open position to the closed position, the tabs 126 and 128 of the latch 110 make contact with the heat sink 204 at different times, to balance the forces applied by the tabs 126 and 128 against the heat sink 204 while the heat sink 204 is being installed within the bracket 102. In particular, first the tab 128 makes contact with the heat sink 204, and then the tab 126 makes contact with the heat sink 204.

It is finally noted that, although specific embodiments have been illustrated and described herein, it will be appreciated by those of ordinary skill in the art that any arrangement that is calculated to achieve the same purpose may be substituted for the specific embodiments shown. Other applications and uses of embodiments of the invention, besides those described herein, are amenable to at least some embodiments. This application is intended to cover any adaptations or variations of the present invention. Therefore, it is manifestly intended that this invention be limited only by the claims and equivalents thereof.

We claim:

1. A system comprising:
    a circuit board on which an integrated circuit is disposed;
    a heat sink retention module including a bracket, a plurality of members, and a plurality of coil springs, the members extending through the coil springs and corresponding holes within the bracket to attach to the circuit board; and,
    a heat sink removably installed within the bracket of the heat sink retention module in a toolless manner, such that the heat sink comes into contact with the integrated circuit,
    wherein the heat sink retention module further includes a latch rotatably attached to the bracket and having an open position wherein the heat sink is insertable into and removable from the bracket and a closed position wherein the heat sink is secured to the bracket.

2. The system of claim 1, wherein the members are each a screw.

3. The system of claim 1, wherein the bracket is permitted to float along an axis perpendicular to a surface of the circuit board, as a result of the members extending through the corresponding holes within the bracket to attach to the circuit board.

4. The system of claim 3, wherein the heat sink and the bracket are joined together in the toolless manner to become a single entity that is permitted to float along an axis perpendicular to a surface of the circuit board.

5. The system of claim 1, wherein the coil springs are tuned to provide and define a predetermined force at which the heat sink is pushed against the integrated circuit.

6. The system of claim 1, wherein the latch has a plurality of tabs to secure an end of the heat sink to the bracket,
    and wherein the tabs are bent at different angles relative to one another to balance forces applied by the tabs against the heat sink while the heat sink is being installed within the bracket.

7. The system of claim 6, wherein the latch is user-rotatable downwards to move the latch from the open position to the closed position and upwards to move the latch from the closed position to the open position,
    wherein the tabs comprise a first tab and a second tab bent at the different angles such that the first tab makes contact with the heat sink before the second tab makes contact with the heat sink while the latch is moved from the open position to the closed position, to balance the forces applied by the tabs against the heat sink while the heat sink is being installed within the bracket.

8. The system of claim 6, wherein bracket further includes a slot opposite the tabs of the latch, and the heat sink includes a tab corresponding to and inserted into the slot.

9. The system of claim 1, wherein the heat sink retention module further includes:
    a plurality of washers against which corresponding heads of the members contact;
    a plurality of clips inserted into corresponding grooves of the members,
    wherein the coil springs are positioned around the members between the washers and the clips.

10. The system of claim 1, wherein the circuit board comprises a plurality of standoffs extending from a surface of the circuit board, the members attached to the circuit board by mating with the standoffs.

11. A heat sink retention module for installation of a heat sink over an integrated circuit on a circuit board in a toolless manner, comprising:
    a bracket having a plurality of holes;
    a plurality of coil springs inserted within the holes of the bracket;
    a plurality of members inserted through the coil springs and attachable to the circuit board; and, a latch rotatably attached to the bracket and having an open position in which the heat sink is insertable into and removable from the bracket, and a closed position in which the heat sink is secured to the bracket, wherein the heat sink is removably installable within the bracket in the toolless manner, such that the heat sink comes into contact with the integrated circuit.

12. The heat sink retention module of claim 11, wherein the bracket is permitted to float along an axis perpendicular to a surface of the circuit board, as a result of the members extending through the corresponding holes within the bracket to attach to the circuit board.

13. The heat sink retention module of claim 11, wherein the coil springs are tuned to provide and define a predetermined force at which the heat sink is pushed against the integrated circuit.

14. The heat sink retention module of claim 12, wherein the latch further has a plurality of tabs to secure an end of the heat sink to the bracket, the tabs bent at different angles relative to one another to balance forces applied by the tabs against the heat sink while the heat sink is being installed within the bracket.

15. The heat sink retention module of claim 11, further comprising a plurality of clips inserted into corresponding grooves of the members, wherein the coil springs are positioned around the members between heads of the members and the clips.

16. A method comprising:

inserting a tab of a heat sink into a corresponding slot of a bracket of a heat sink retention module, by a user in a toolless manner, the heat sink retention module including a bracket, a plurality of members, and a plurality of coil springs, the members extending through the coil springs and corresponding holes within the bracket to attach to a circuit board; and, moving, by the user in the toolless manner, a latch rotatably attached to the bracket, from an open position to a closed position, to secure the heat sink to the bracket such that the heat sink comes into contact with an integrated circuit on the circuit board.

17. The method of claim 16, wherein securing the heat sink to the bracket results in the heat sink and the bracket being joined together in the toolless manner to become a single entity, the single entity permitted to float along an axis perpendicular to a surface of the circuit board as a result of the members extending through the corresponding holes within the bracket to attach to the circuit board.

18. The method of claim 16, wherein securing the heat sink to the bracket results in the heat sink being pushed against the integrated circuit at a predetermined force defined and provided by the coil springs.

19. The method of claim 16, wherein as the user moves the latch from the open position to the closed position, a plurality of tabs of the latch and that are bent at different angles relative to one another make contact with the heat sink at different times, to balance forces applied by the tabs against the heat sink while the heat sink is being installed within the bracket.

* * * * *